(12) United States Patent
Wu et al.

(10) Patent No.: US 7,414,511 B2
(45) Date of Patent: Aug. 19, 2008

(54) ELECTROMAGNETIC INTERFERENCE FILTER

(75) Inventors: Chen-Feng Wu, Taoyuan Hsien (TW); Heng-Cheng Chou, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 302 days.

(21) Appl. No.: 11/247,177

(22) Filed: Oct. 12, 2005

(65) Prior Publication Data

US 2006/0082948 A1 Apr. 20, 2006

(30) Foreign Application Priority Data

Oct. 15, 2004 (TW) .............................. 93131268 A

(51) Int. Cl.
*H01F 27/24* (2006.01)
(52) U.S. Cl. ..................................................... 336/212
(58) Field of Classification Search .................. 336/83, 336/212–215, 233–234
See application file for complete search history.

(56) References Cited

U.S. PATENT DOCUMENTS

| 5,028,904 A | * | 7/1991 | Kurano ........................ 336/96 |
| 5,629,661 A | * | 5/1997 | Ooi et al. ..................... 336/198 |
| 5,635,890 A | * | 6/1997 | Yamaguchi et al. ........... 336/83 |
| 5,793,273 A | * | 8/1998 | Yamaguchi et al. ......... 336/198 |
| 6,014,071 A | * | 1/2000 | Onishi et al. ................. 336/170 |
| 6,078,242 A | * | 6/2000 | Tomita et al. ................ 336/212 |
| 6,624,724 B2 | * | 9/2003 | Tomita et al. ................ 333/181 |

\* cited by examiner

*Primary Examiner*—Tuyen T. Nguyen
(74) *Attorney, Agent, or Firm*—Birch, Stewart, Kolasch & Birch, LLP

(57) ABSTRACT

An electromagnetic interference (EMI) filter includes a first magnetomotive element, a first wire, a second wire, and a second magnetomotive element. The second magnetomotive element forms a closed magnetic loop, which comprises a first portion penetrating a through hole of the first magnetomotive element. Thus, the first wire and the second wire in the Filter filter not only differential mode noise but also common mode noise.

20 Claims, 8 Drawing Sheets

ELECTROMAGNETIC INTERFERENCE FILTER

BACKGROUND OF THE INVENTION

1. Field of the Invention

The invention relates to electromagnetic interference (EMI) filters, and particularly to an EMI filter suitable for filtering common mode noise and differential mode noise.

2. Brief Discussion of the Related Art

Presently, electronic devices are frequently used in daily life, and power is required for operation thereof. When alternating current (AC) power is employed, parasitic capacitance or stray capacitance may occur in the power supply or the high-frequency converter, and noise of stray current in the AC current, leading to electromagnetic interference (EMI).

Generally, noise in the AC current comprises differential mode noise and common mode noise. There are several conventional circuit compositions for filtering the noise. One conventional circuit composition is shown in FIG. 1, in which an AC power supply 10 is connected to a first differential mode EMI filter 11 and a second differential mode EMI filter 12, and the two differential mode EMI filters are electrically connected to the two input terminals of a common mode EMI filter 13 respectively. The two input terminals of the common mode EMI filter 13 are electrically connected to two terminals of a loading 14 respectively, and the loading 14 has a grounding terminal 15 to guide excess current to the ground. The first differential mode EMI filter 11 and the second differential mode EMI filter 12 are employed to filter differential mode noise. Referring to FIG. 3, the first differential mode EMI filter 11 and the second differential mode EMI filter 12 are respectively formed by a column-shaped core wound with a wire 111. The current flows from an input terminal 1111 of the wire 111, circles the core 11 repeatedly and leaves through an output terminal 1112. With magnetic induction of the core 11, differential mode noise is filtered. The common mode EMI filter 13 filters common mode noise. Referring to FIG. 2, the common mode EMI filter 13 is formed by a ring-shaped core 130 wound with first wire 131 and second wire 132. The AC power supply is electrically connected to the first input terminal 1311 and the second input terminal 1321. Current from the first input terminal 1311 encircles a portion of the ring-shaped core 130 and is output through the first output terminal 1312, and current from the second input terminal 1321 encircles another portion of the ring-shaped core 130 and is output through the second output terminal 1322. The first wire 131 and the second wire 132 are wound in the same direction. Thus, the common mode EMI filter 13 does not perform any induction for the differential mode noise due to neutralized magnetic induction, but the flux generated for the common mode noise is doubled, and the common mode noise of the AC current is filtered by the magnetic induction of the ring-shaped core 130. With the above-mentioned circuit, common mode noise and differential mode noise are filtered, and the first differential mode EMI filter 11, the second differential mode EMI filter 12 and the common mode EMI filter 13 can be alternatively disposed without limited thereto. For example, the AC power supply electrically connected to the common mode EMI filter 13 and to the first differential mode EMI filter 11 and the second differential mode EMI filter 12.

In the above-mentioned circuit composition, however, two differential mode EMI filters and one common mode EMI filter are required to filter common mode noise and differential mode noise. As a result, cost of the electrical device is increased, and manufacturing thereof complicated. There is a need to provide an element to filter common mode noise and differential mode noise.

SUMMARY OF THE INVENTION

Accordingly, the invention discloses an electromagnetic interference (EMI) filter for common mode noise and differential mode noise, which not only reduces cost of the circuit but also simplifies the manufacturing.

The present invention discloses an EMI filter, which comprises: a first magnetomotive element with a through hole, the through hole axially penetrating the first magnetomotive element; a first wire and a second wire wound around the first magnetomotive element; and a second magnetomotive element with a first portion and a second portion, the first portion penetrating the through hole, and the first portion and the second portion forming a closed magnetic loop.

The first magnetomotive element can be an iron core or a ferrite core.

The first magnetomotive element can comprise a first bobbin portion wound by the first wire and a second bobbin portion wound by the second wire. The first bobbin portion and the second bobbin portion can be ring-shaped concaves depressed on the first magnetomotive element and surrounding the through hole.

The second magnetomotive element can be formed by a first block and a second block. The second magnetomotive element can be a θ-shaped closed magnetic loop or an O-shaped closed magnetic loop.

The first block and the second block can be respective E-shaped magnetomotive blocks and are mirrored-disposed. A first column of the first block and a second column of the second block penetrate the through hole relatively, the first column and the second column form the first portion, and the second magnetomotive element forms a O-shaped closed magnetic loop.

The first block can be an E-shaped magnetomotive block, and the second block can be an I-shaped magnetomotive block. The second block is disposed at an open end of the first block, a first column of the first block penetrates the through hole, the first column forms the first portion, and the second magnetomotive element forms a O-shaped closed magnetic loop.

The first block and the second block can be respective U-shaped magnetomotive blocks and are mirrored-disposed. A first column of the first block and a second column of the second block penetrate the through hole relatively, the first column and the second column form the first portion, and the second magnetomotive element forms an O-shaped closed magnetic loop.

The first block is a U-shaped magnetomotive block, and the second block is an I-shaped magnetomotive block. The second block is disposed at an open end of the first block, a first column of the first block penetrates the through hole, the first column forms the first portion, and the second magnetomotive element forms an O-shaped closed magnetic loop.

The columns of the first block and the second block can be rectangular columns, cylinders, or polygon columns. The columns of the first block and the second block can comprise the same shape and cross-sectional area.

The first wire and the second wire can be wound in the same direction.

The first block and the second block can be iron cores or ferrite cores.

The EMI filter can further comprise a base for positioning the EMI filter. The base can be made of a nonconducting material, such as plastic.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
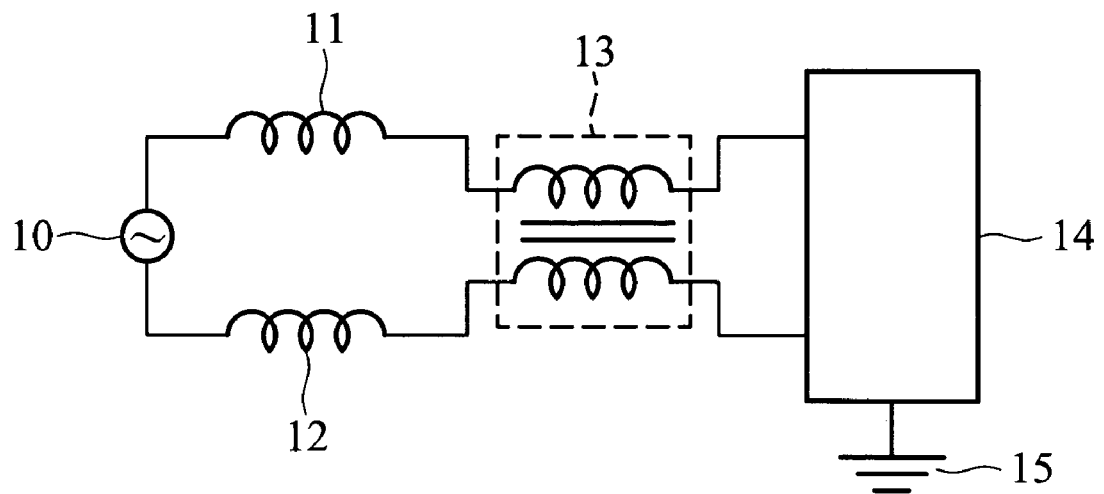
FIG. 1 is a schematic view of a conventional circuit composition for filtering noise.
Figure 2:
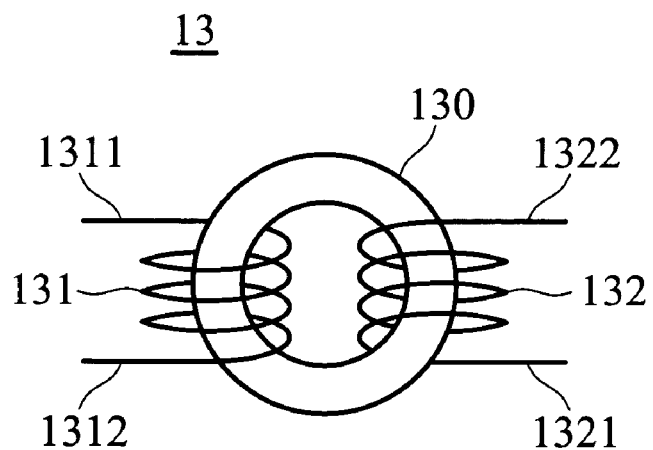
FIG. 2 is a schematic view of a conventional common mode EMI filter.
Figure 3:
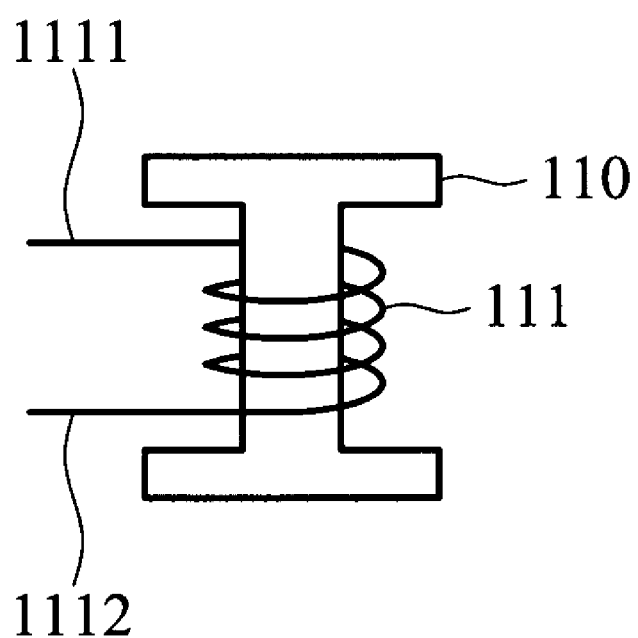
FIG. 3 is a schematic view of a conventional differential mode EMI filter.
Figure 4:
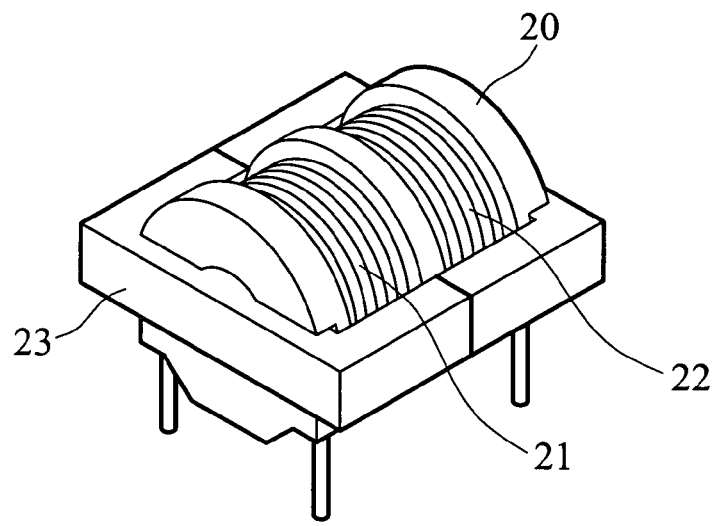
FIG. 4 is a perspective view of an EMI filter of a first embodiment of the present invention.

FIG. 4 shows an EMI filter 2 of the present invention. The EMI filter 2 comprises a first magnetomotive element 20, a first wire 21, a second wire 22, and a second magnetomotive element 23. The first magnetomotive element 20 is a cylinder but is not limited thereto. The first wire 21 and the second wire 22 are wound around the first magnetomotive element 20 respectively as differential mode EMI filters. The second magnetomotive element 23 provides a closed magnetic loop for the first magnetomotive element 20 such that the EMI filter 2 selves as a common mode EMI filter. Detailed structures of the EMI filter are described as follows.

Figure 5:
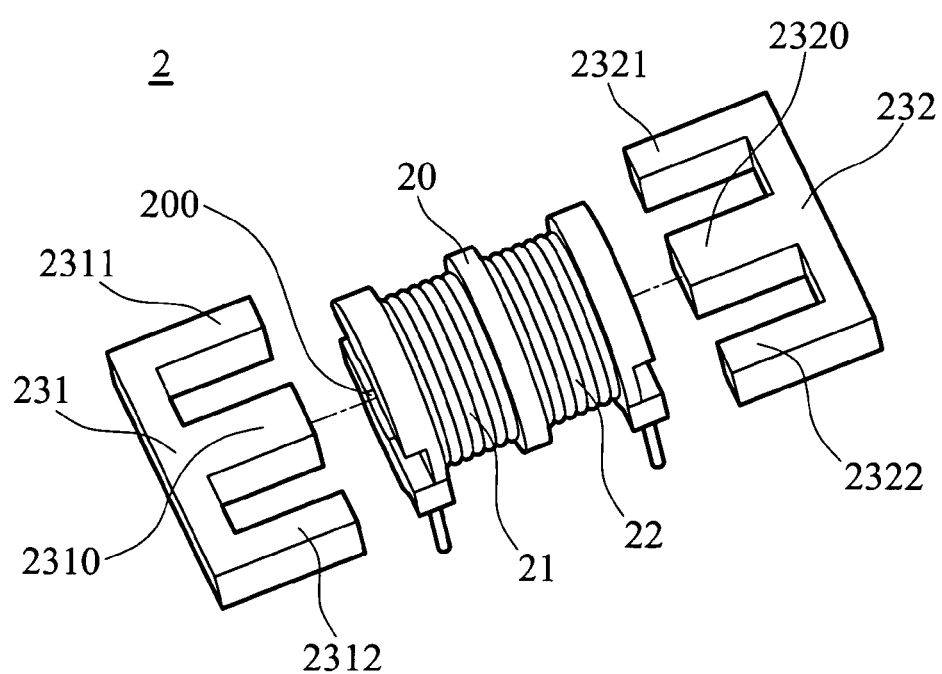
FIG. 5 is a perspective dissembled view of the EMI filter of the first embodiment of the present invention.
Figure 6:
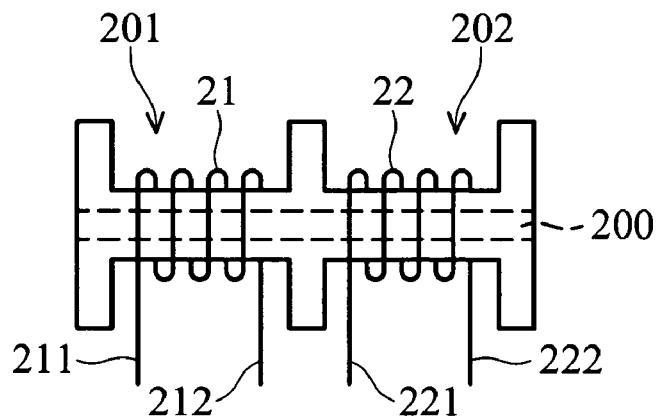
FIG. 6 is a plan view of a first magnetomotive element of the EMI filter of the first embodiment of the present invention.

FIG. 5 shows a perspective dissembled view of the EMI filter 2 of the first embodiment. The first wire 21 and the second wire 22 are wound around the first magnetomotive element 20 respectively, and the first magnetomotive element 20 can be an iron core pressed by iron powder or a ferrite core pressed and sintered by ferrite powder. The first magnetomotive element 20 has a through hole 200, which axially penetrates the first magnetomotive element 20. Referring to FIG. 6, the first magnetomotive element 20 comprises a first bobbin portion 201 wound by the first wire 21 and a second bobbin portion 202 wound by the second wire 22. Preferably, the first bobbin portion 201 and the second bobbin portion 202 can be respectively ring-shaped concaves depressed on the first magnetomotive element 20 and surrounding the through hole 200. However, the first bobbin portion 201 and the second bobbin portion 202 are not limited thereto and can be disposed on the surface of the first magnetomotive element 20 instead of indented therein. The first wire 21 and the second wire 22 can be wound in the same direction. That is, the winding direction of the first wire 21 around the first magnetomotive element 20 from the first input terminal 211 to the first output terminal 212 and the winding direction of the second wire 22 around the first magnetomotive element 20 from the second input terminal 221 to the second output terminal 222 are the same. Thus, the first wire 21 and the second wire 22 filter differential mode noise due to magnetic induction between the first wire 21, the second wire 22 and the first magnetomotive element 20. As a result, the EMI filter 2 can serve as two differential mode EMI filters.

Figure 7:
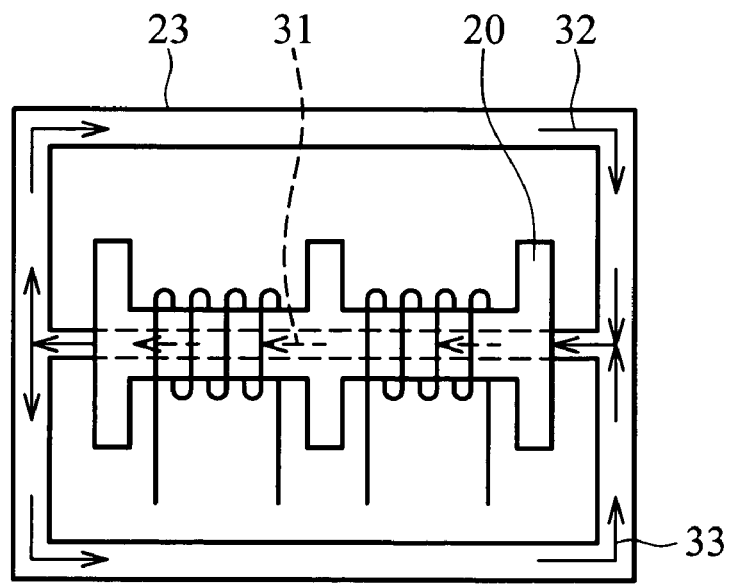
FIG. 7 is a plan view of the EMI filter of the first embodiment of the present invention.

Referring to FIG. 5, the second magnetomotive element 23 is formed by a first block 231 and a second block 232. The first block 231 and the second block 232 can be iron cores pressed by iron powder or ferrite cores pressed and sintered by ferrite powder. Referring to FIG. 7, the first block 231 and the second block 232 can be respective E-shaped magnetomotive blocks and are mirrored-disposed. A first column 2310 of the first block 231 and a second column 2320 of the second block 232 penetrate the through hole 200 relatively, and the first column 2310 of the first block 231 and the second column 2320 of the second block 232 form the first portion 31 of the second magnetomotive element 23. The other two columns (i.e. third columns 2311, 2312) of the first block 231 and the other two columns (i.e. third columns 2321, 2322) of the second block 232 are disposed relatively opposite to each other, forming two groups of second portions 32, 33. Thus, the second magnetomotive element 23 forms a O-shaped closed magnetic loop. The first wire 21 and the second wire 22 filter differential mode noise in relation to the second magnetomotive element 23, and the EMI filter 2 can serve as a common mode EMI filters.

Further, the first column 2310 of the first block 231 and the second column 2320 of the second block 232 can contact each other. When a clearance exists between the first column 2310 of the first block 231 and the second column 2320 of the second block 232, the width of the clearance is in inverse proportion to the induction of the second magnetomotive element 23. As a result, the EMI filter 2 can be designed accordingly.

According to the embodiment, the EMI filter of the invention filters common mode noise and differential mode noise, reducing the number of EMI filters required in the electrical device and cost of the circuit. When the EMI filter of the present invention is employed in an electrical device, only four welding connection points are required rather than the eight welding connection points in conventional EMI filters, thus simplifying the manufacturing process.

Figure 8:
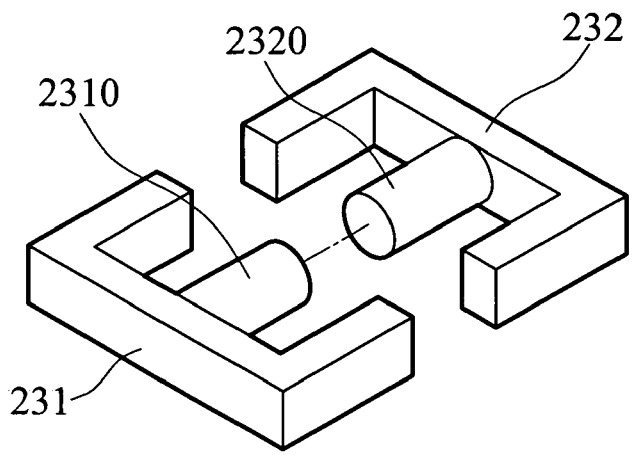
FIG. 8 is a perspective view of a second magnetomotive element of the EMI filter of the first embodiment of the present invention.
Figure 9:
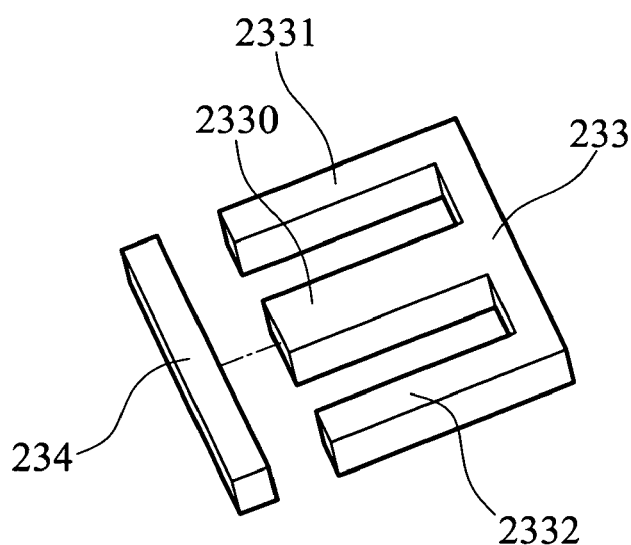
FIG. 9 is a perspective view of another second magnetomotive element of the EMI filter of the first embodiment of the present invention.

In the EMI filter 2 of the first embodiment, the second magnetomotive element 23 provides magnetic induction to the first wire 21 and the second wire 22. Thus, shape of the first block 231 and the second block 232 are not limited to those in the illustration in FIG. 5. Referring to FIG. 8, for example, the first column 2310 of the first block 231 and the second column 2320 of the second block 232 can be cylinders, which correspond to the cylindrical through hole 200 for enhancing magnetic induction of the first column 2310 of the first block 231 and the second column 2320 of the second block 232. Further, the first column 2310 of the first block 231 and the second column 2320 of the second block 232 can be rectangular columns or polygon columns. As long as the shapes of the first column 2310 of the first block 231 and the second column 2320 of the second block 232 correspond to the shape of the through hole 200, magnetic induction is enhanced. Referring to FIG. 9, the first block 233 of the second magnetomotive element 23 can be an E-shaped magnetomotive block, and the second block 234 can be an I-shaped magnetomotive block. The second block 234 is disposed at an open end of the first block 233, and a first column 2330 of the first block 233 penetrates the through hole 200 to form the first portion 31 of the second magnetomotive element 23 as shown in FIG. 7. The other two columns (i.e. third columns 2331, 2332) of the first block 233 and the second block 234 form two groups of second portions 32, 33 as shown in FIG. 7. Thus, the second magnetomotive element 23 forms a O-shaped closed magnetic loop, similar to the first embodiment.

Figure 10:
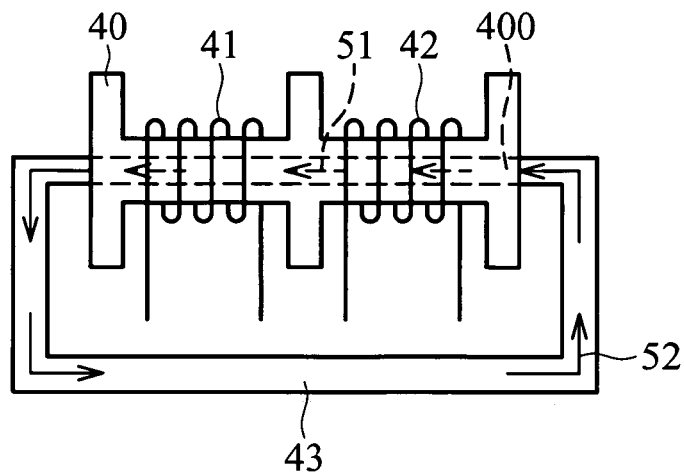
FIG. 10 is a plan view of an EMI filter of a second embodiment of the present invention.

Referring to FIG. 10, an EMI filter 4 of a second embodiment is provided, similar to the EMI filter of the first embodiment. The difference between the EMI filter 2 and the EMI filter 4 is the shape of the closed magnetic loop. The second magnetomotive element 23 in the first embodiment is a O-shaped closed magnetic loop, and the second magnetomotive element 43 in the second embodiment is an O-shaped closed magnetic loop. The first wire 41 and the second wire 42 filter differential mode noise due to magnetic induction between the first wire 41, the second wire 42 and the first magnetomotive element 40. Further, the first portion 51 of the second magnetomotive element 43 penetrates the through hole 400 of the first magnetomotive element 40 and forms an O-shaped closed magnetic loop with the second portion 52. Thus, the first wire 41 and the second wire 42 filter differential mode noise in relation to the second magnetomotive element 43. Detail of the structure and conception of the second embodiment is similar to the first embodiment, and description is thus omitted.

Figure 11:
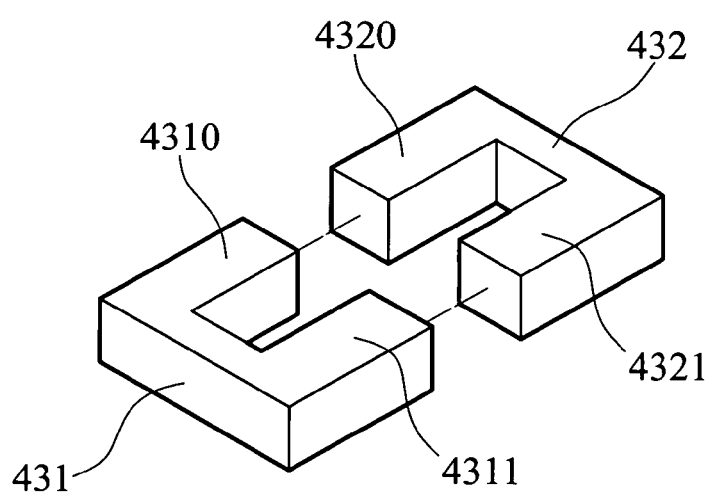
FIG. 11 is a perspective view of a second magnetomotive element of the EMI filter of the second embodiment of the present invention.
Figure 12:
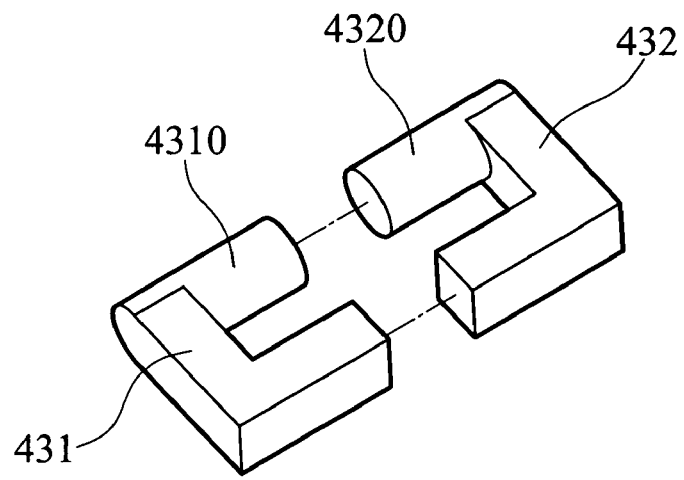
FIG. 12 is a perspective view of another second magnetomotive element of the EMI filter of the second embodiment of the present invention.
Figure 13:
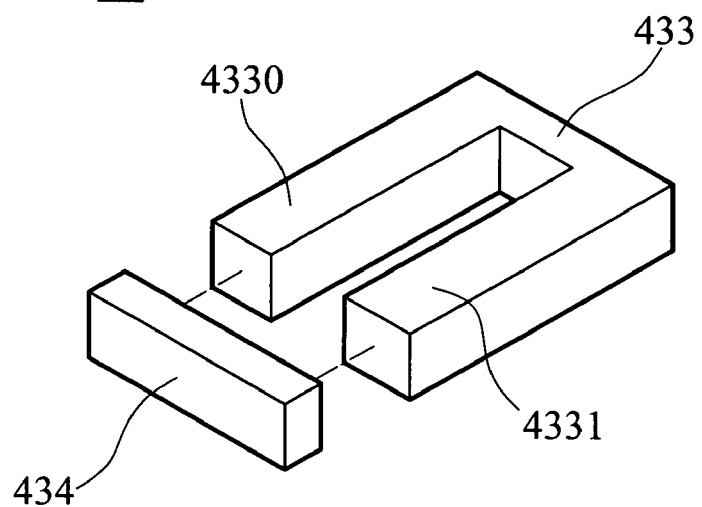
FIG. 13 is a perspective view of a further second magnetomotive element of the EMI filter of the second embodiment of the present invention.

Accordingly, the second magnetomotive element 43 of the EMI filter 4 can be formed by two U-shaped magnetomotive blocks. Referring to FIG. 11, the first block 431 and the second block 432 can be respective U-shaped magnetomotive blocks and are mirrored-disposed. A first column 4310 of the first block 431 and a second column 4320 of the second block 432 penetrate the through hole 400 relatively, and the first column 4310 of the first block 431 and the second column 4320 of the second block 432 form the first portion 51 of the second magnetomotive element 43 in FIG. 10. The other column (i.e. a third column 4311 of the first block 431 and the other column (i.e. a third column 4321) of the second block 432 are disposed relatively opposite to each other, forming a second portion 51 as shown in FIG. 10. Thus, the second magnetomotive element 43 forms an O-shaped closed magnetic loop, and the EMI filter 4 filters differential mode noise. Another embodiment of the second magnetomotive element 43 is shown in FIG. 12. The first column 4310 of the first block 431 and the second column 4320 of the second block 432 can be cylinders, corresponding to the cylindrical through hole 400 for enhancing magnetic induction of the first column 4310 of the first block 431 and the second column 4320 of the second block 432. Further, the first column 4310 of the first block 431 and the second column 4320 of the second block 432 can be rectangular columns or polygonal columns. As long as the shapes of the first column 4310 of the first block 431 and the second column 4320 of the second block 432 correspond to the shape of the through hole 400, magnetic induction is enhanced. A further embodiment of the second magnetomotive element 43 is shown in FIG. 13. The first block 433 of the second magnetomotive element 43 can be a U-shaped magnetomotive block, and the second block 434 can be an I-shaped magnetomotive block. The second block 434 is disposed at an open end of the first block 433, and a first column 4330 of the first block 433 penetrates the through hole 400 to form the first portion 51 of the second magnetomotive element 43 as shown in FIG. 10. The other column (i.e. a third column 4331) of the first block 433 and the second block 434 form a second portion 52 as shown in FIG. 10. Thus, the second magnetomotive element 43 forms an O-shaped closed magnetic loop, similar to the second embodiment.

Figure 14:
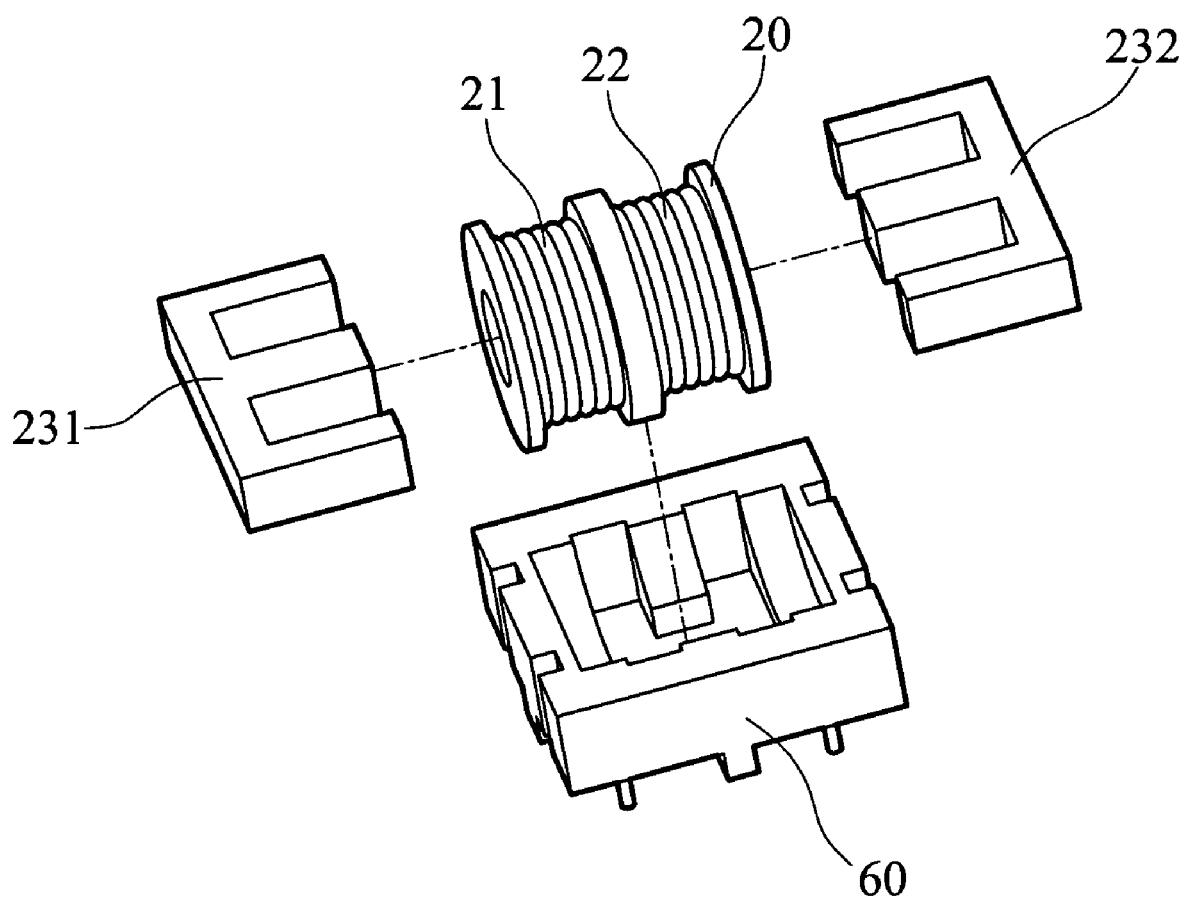
FIG. 14 is a perspective dissembled view of an assembly of the EMI filter of the first embodiment of the present invention and a base.

It should be noted that a base can be further provided for positioning the EMI filter. Referring to FIG. 14, an assembly of the EMI filter 2 of the first embodiment and a base 60 is illustrated. The base 60 can be of a nonconducting material, such as plastic, to enhance manufacture of the EMI filter.

While the invention has been described by way of example and in terms of preferred embodiment, it is to be understood that the invention is not limited thereto. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A filter, comprising:
   a bobbin having a through hole, the bobbin being made of magnetomotive material;
   a first wire wound around the bobbin;
   a second wire wound around the bobbin; and
   a magnetomotive element comprising a first portion and a second portion, wherein the first portion penetrates the through hole, and the first portion and the second portion completely form a closed magnetic loop together with the bobbin, without any other magnetic element necessary for forming the closed magnetic loop.

2. The filter as claimed in claim 1, wherein the bobbin is an iron core.

3. The filter as claimed in claim 1, wherein the bobbin is a ferrite core.

4. The filter as claimed in claim 1, wherein the bobbin has a first bobbin portion wound by the first wire and a second bobbin portion wound by the second wire.

5. The filter as claimed in claim 4, wherein the first bobbin portion is a ring-shaped concave depressed on the bobbin and surrounding the through hole.

6. The filter as claimed in claim 4, wherein the second bobbin portion is a ring-shaped concave depressed on the bobbin and surrounding the through hole.

7. The filter as claimed in claim 1, wherein the magnetomotive element is formed by a first block and a second block, the first block and the second block are two E-shaped magnetomotive blocks, two U-shaped magnetomotive blocks, a E-shaped magnetomotive block and an I-shaped magnetomotive block respectively, or a U-shaped magnetomotive block and an I-shaped magnetomotive block respectively.

8. The filter as claimed in claim 7, wherein the first block and the second block are respective E-shaped magnetomotive blocks and are mirrored-disposed, a first column of the first block and a second column of the second block penetrate the through hole relatively, the first column and the second column form the first portion, and the magnetomotive element forms a θ-shaped closed magnetic loop.

9. The filter as claimed in claim 7, wherein the first block is an E-shaped magnetomotive block, the second block is an I-shaped magnetomotive block, the second block is disposed at an open end of the first block, a first column of the first block penetrates the through hole, the first column forms the first portion, and the magnetomotive element forms a θ-shaped closed magnetic loop.

10. The filter as claimed in claim 7, wherein the first block and the second block are respective U-shaped magnetomotive blocks and are mirrored-disposed, a first column of the first block and a second column of the second block penetrate the through hole relatively, the first column and the second column form the first portion, and the magnetomotive element forms an O-shaped closed magnetic loop.

11. The filter as claimed in claim 7, wherein the first block is a U-shaped magnetomotive block, the second block is an I-shaped magnetomotive block, the second block is disposed at an open end of the first block, a first column of the first block penetrates the through hole, the first column forms the first portion, and the second magnetomotive element forms an O-shaped closed magnetic loop.

12. The filter as claimed in claim 7, wherein the first block and the second block have a rectangular column, a cylindrical column, or a polygonal column respectively.

13. The filter as claimed in claim 7, wherein the first block is an iron core.

14. The filter as claimed in claim 7, wherein the second block is an iron core.

15. The filter as claimed in claim 7, wherein the first block is a ferrite core.

16. The filter as claimed in claim 7, wherein the second block is a ferrite core.

17. The filter as claimed in claim 1, further comprising a base for positioning the filter.

18. The filter as claimed in claim 17, wherein the base is made of nonconducting materials.

19. The filter as claimed in claim 18, wherein the base is made of plastic material.

20. The filter as claimed in claim 1, wherein the first wire and the second wire are wound in the same direction.

* * * * *